United States Patent [19]
Miller

[11] Patent Number: 5,696,773
[45] Date of Patent: Dec. 9, 1997

[54] APPARATUS FOR PERFORMING LOGIC AND LEAKAGE CURRENT TESTS ON A DIGITAL LOGIC CIRCUIT

[75] Inventor: Charles A. Miller, Fremont, Calif.

[73] Assignee: Credence Systems Corporation, Fremont, Calif.

[21] Appl. No.: 639,165

[22] Filed: Apr. 25, 1996

[51] Int. Cl.$^6$ ............................................. G01R 31/28
[52] U.S. Cl. ............................................ 371/28; 327/334
[58] Field of Search .......................... 371/28, 20.1, 22.1, 371/21.4; 324/158 R, 73.1, 158 T; 327/108, 407, 443, 321, 334; 307/108, 109

[56] References Cited

U.S. PATENT DOCUMENTS

| | | | |
|---|---|---|---|
| Re. 31,056 | 10/1982 | Chau et al. | 324/73 R |
| 4,989,209 | 1/1991 | Littlebury et al. | 371/22.1 |
| 5,059,889 | 10/1991 | Heaton | 323/285 |
| 5,132,564 | 7/1992 | Fletcher et al. | 307/443 |
| 5,146,159 | 9/1992 | Lau et al. | 324/158 R |
| 5,200,696 | 4/1993 | Menis et al. | 324/158 R |
| 5,212,443 | 5/1993 | West et al. | 324/158 R |
| 5,282,271 | 1/1994 | Hsieh et al. | 395/275 |
| 5,294,882 | 3/1994 | Tanaka | 324/158 R |
| 5,304,923 | 4/1994 | Tanaka et al. | 324/158 R |
| 5,412,315 | 5/1995 | Tsuda | 324/158 R |
| 5,430,400 | 7/1995 | Herlein et al. | 327/108 |

*Primary Examiner*—Robert W. Beausoliel, Jr.
*Assistant Examiner*—Nadeem Iqbal
*Attorney, Agent, or Firm*—Smith-Hill and Bedell

[57] ABSTRACT

An apparatus for performing logic and leakage current tests on a logic circuit device under test (DUT) includes a local module for each terminal of the DUT. For performing logic test, each local module has a driver for supplying a logic signal input to the DUT terminal, a comparator for detecting the DUT output at the terminal, and a clamping circuit for limiting the voltage swing at the DUT terminal during the logic test. For performing a leakage current test, each local module includes a source for supplying a parametric signal to the DUT terminal. The voltage the parametric signal produces at the DUT terminal, as detected by the comparator, indicates the terminal's leakage current. The parametric signal source and the clamping circuit are connected to the DUT terminal through Schottky diodes. During a logic test the parametric signal source is isolated from the DUT terminal by reverse biasing the Schottky diodes linking the parametric signal source to the DUT terminal. Conversely, during a leakage current test, the clamping circuit is isolated from the DUT terminal by reverse biasing the Schottky diodes linking it to the DUT terminal. The Schottky diodes, when reverse biased, have very low capacitance and leakage current. Thus a DUT terminal leakage current measurement is not substantially influenced by leakage current through the clamping circuit and the edges of logic signal pulses are not substantially affected by capacitance added to the DUT terminal by the parametric signal source.

31 Claims, 3 Drawing Sheets

APPARATUS FOR PERFORMING LOGIC AND LEAKAGE CURRENT TESTS ON A DIGITAL LOGIC CIRCUIT

BACKGROUND OF THE INVENTION

1. Field of the Invention

The present invention relates in general to digital logic circuit testers and in particular to an apparatus for performing both logic and leakage current tests on a digital logic circuit.

2. Description of Related Art

Logic circuit manufacturers routinely perform both logic and parametric tests on their products. To test the logic of a circuit, a typical prior art logic tester stimulates various terminals of the circuit with input logic signals while monitoring various output logic signals produced by the tester in response to the input logic signal stimulus to determine if the output signals exhibit expected logic patterns. A "parametric" test measures analog characteristics of the circuit at its terminals. One of the most important parametric characteristics of a logic circuit is its leakage current, the amount of current an input terminal of a logic circuit sources or sinks when the terminal is driven to a high or low logic level. Leakage current is typically measured by connecting the terminal to a voltage source through a precision resistor and measuring the voltage drop across the terminal. The voltage drop is proportional to the leakage current.

U.S. Pat. No. Re. 31,056, reissued Oct. 12, 1982 to Chau et al discloses a circuit tester for performing both logic and parametric tests on a circuit. A logic signal driver within the tester supplies a logic signal to a terminal of a device under test ("DUT"). A parametric signal source within the tester supplies a parametric test signal to the DUT terminal. Since the logic signal driver and parametric signal source are employed for different tests and would interfere with one another if concurrently tied to the DUT terminal, the two signal sources are linked to the DUT terminal through separate relay contacts so that only one signal source is connected to the DUT terminal at a time. While the use of a relay to isolate the logic and parametric signal sources allows one tester apparatus to perform both parametric and logic tests, the relay requires a relatively large amount of current to switch, is relatively slow and bulky and is subject to mechanical failure after repeated use.

U.S. Pat. No. 4,989,209 issued Jan. 29, 1991 to Littlebury et al describes an integrated circuit tester including both logic and parametric test signal sources alternatively connected to a DUT terminal via transistor switches. While transistor switches are smaller, faster and less subject to failure than relay switches, leakage current in transistor switches connected to a DUT terminal can adversely affect a measurement of the DUT terminal's leakage current. Also the capacitance of a transistor switch linking the logic signal source to the DUT terminal can adversely affect the edge characteristics of the logic signal.

In testing the logic of high speed integrated circuits, the output impedance of a logic test signal source should be matched to the impedance of the transmission line conveying a logic signal from its source to the DUT terminal in order to avoid voltage spikes on the leading and trailing edges of logic signal pulses. However in practice it is difficult to perfectly match the source and transmission line impedances. To alleviate voltage spikes is helpful to tie a clamping circuit to the DUT terminal. A clamping circuit typically includes of a pair of transistors linking the DUT terminal to high and low voltage sources. As the voltage at the DUT terminal begins to rise above an upper limit, the transistor connecting the DUT terminal to the low voltage source begins to turn on, thereby absorbing excess current flowing into the DUT terminal and limiting the terminal voltage rise. Similarly, as the voltage at the DUT begins to fall below a lower limit, the transistor linking the DUT terminal to the high voltage source begins to turn on, thereby supplying additional current into the DUT terminal to limit low voltage spikes at the DUT terminal. While the clamping circuit eliminates voltage spikes at the DUT terminal, it adversely affects terminal leakage current measurement, even when the clamping circuit transistors are turned off, because the clamping transistors themselves have significant leakage current.

What is needed is a fast, compact and reliable system for selectively isolating a parametric test signal source from the DUT terminal during a logic signal test and for isolating a clamping circuit from the DUT terminal during leakage current tests.

SUMMARY OF THE INVENTION

The present invention relates to an automated tester for performing both logic and leakage current tests on an integrated circuit or other logic device under test (DUT). The tester includes a set of local modules, one for each terminal of the DUT. For performing a logic test, each local module has a driver for supplying a logic signal input to the DUT terminal when the DUT terminal is a DUT input, a comparator for detecting the logic level of a signal produced by the DUT at the terminal when the terminal is a DUT output, and a clamping circuit for limiting voltage swing at the DUT terminal during the logic test. For performing a leakage current test, each local module includes a source for supplying a parametric signal to the DUT terminal. The comparator detects the resulting voltage level produced at the DUT terminal as a measure of the terminal's leakage current.

The parametric signal source and the clamping circuit are linked to the DUT terminal through hot carrier Schottky diodes. During a logic test the parametric signal source is isolated from the DUT terminal by reverse biasing the Schottky diodes that link the parametric signal source to the DUT terminal. During a leakage current test, the clamping circuit is isolated from the DUT terminal by reverse biasing the Schottky diodes that link it to the DUT terminal. The Schottky diodes, when reverse biased, have very low capacitance and leakage current. Thus a DUT terminal leakage current measurement is not substantially influenced by clamping circuit leakage current and the edges of test signal pulses are not substantially affected by capacitance added to the DUT terminal by the parametric signal source. The Schottky diodes used to switch the clamping circuit and parametric signal source are small, reliable, quickly switched and they operate with little power dissipation.

It is accordingly an object of the invention to provide an apparatus for accurately testing both the logic and leakage current of a high speed logic circuit.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
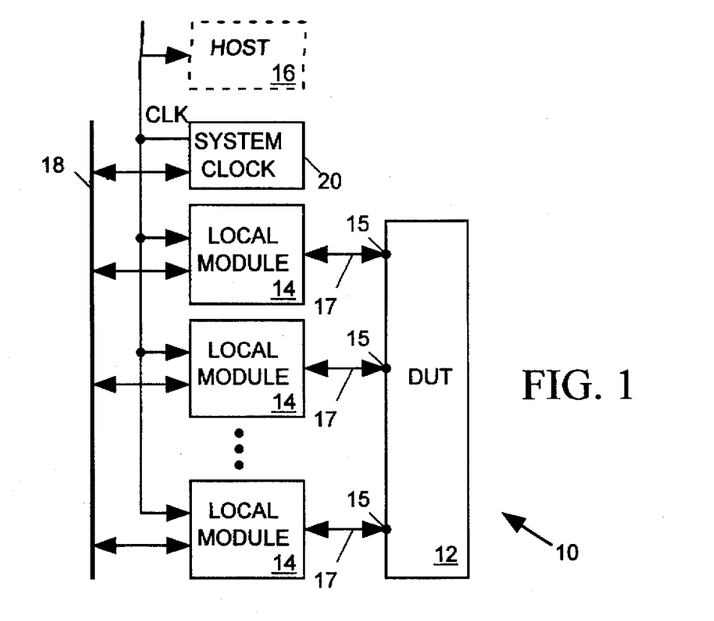
FIG. 1 illustrates an automatic circuit tester in accordance with the present invention in block diagram form.

FIG. 1 is a block diagram depicting an automated tester 10 for performing logic and leakage current tests on an integrated circuit or similar device under test (DUT) 12. Tester 10 includes a set of local modules 14, each connected to a corresponding terminal 15 of DUT 12 through a transmission line 17. Each local module 14 can either transmit a test signal to its corresponding DUT terminal 15 or receive an output signal from the corresponding DUT terminal 15. Local modules 14 are also connected to a host computer 16 through a common bus 18. Bus 18 conveys test instructions, test results, and control signals between the host computer 16 and local modules 14. A clock circuit 20 supplies a system clock signal CLK to local modules 14 and to host computer 16 for timing their operations.

During a logic test, some local modules 14 generate and transmit logic signal patterns to DUT input terminals while other local modules 14 sample output signals produced at DUT output terminals. To program local modules 14 to perform a logic test, the host computer 16 sends programming data to each local module 14 via bus 18 telling each local module when to pulse a DUT input signal or when to sample a DUT output signal. The host computer 16 then sends a START signal concurrently to local modules 14 via bus 18 causing the local modules to begin the logic test. Each local module 14 responds to the START signal by carrying out the sequence of actions indicated by its stored programming data using pulses of the CLK signal as a timing reference. During the logic test, each local module 14 sampling a DUT 12 output signal stores the sample data in an internal acquisition memory. At the end of the test, the host computer 16 reads the acquired data out of the acquisition memory of each local module 14 via bus 18 and makes that data available to a user.

Tester 10 also performs leakage current tests on DUT 12. The high or low level leakage currents of a DUT terminal 15 are the amounts of current the terminal 15 draws when the terminal is driven to a high or low logic level. In a leakage current test, each local module 14 drives its corresponding DUT 12 terminal 15 to high and low logic levels, determines whether the resulting leakage currents are above or below given levels, and then stores data indicating the result in its acquisition memory for later retrieval by host computer 16.

Figure 2:
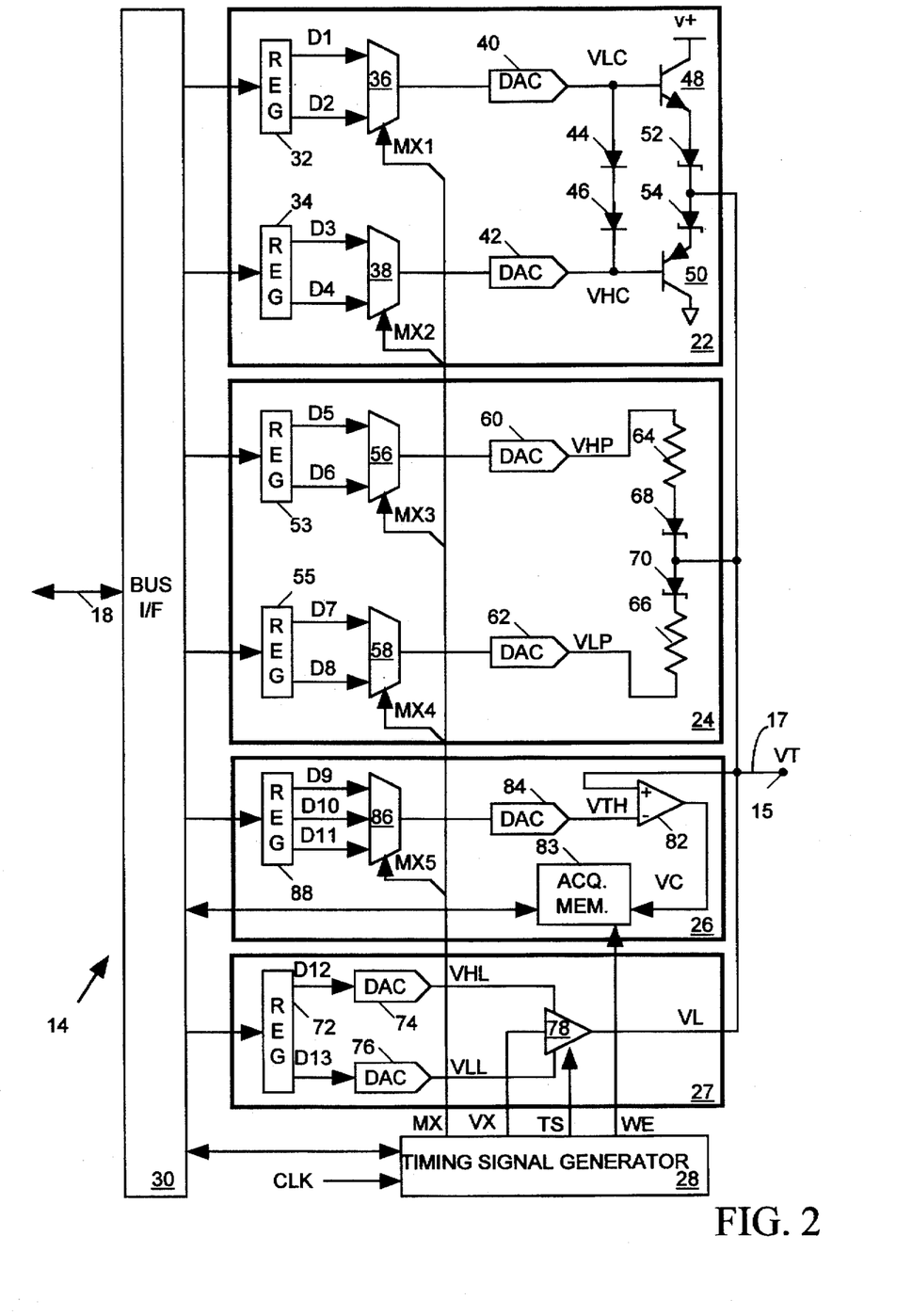
FIG. 2 illustrates a preferred embodiment of a local module of the circuit tester of FIG. 1 in combined block and schematic diagram form.

FIG. 2 illustrates a preferred embodiment of a typical local module 14 in combined block and schematic diagram form. Local module 14 includes several subsystems: a clamping circuit 22, a parametric signal source 24, a data acquisition circuit 26, a logic signal source 27, a timing signal generator 28, and a bus interface circuit 30. The parametric signal source 24 generates output signals for testing the high and low level leakage currents at terminal 15. Source 24 includes two adjustable voltage sources for supplying high and low level test signals to the DUT terminal through precision resistors. Since the amount of voltage drop across each resistor is proportional to the high or low leakage current of terminal 15, the resulting voltage at terminal 15 indicates the leakage current. Data acquisition circuit 26 monitors that terminal voltage VT to determine leakage current. Logic signal source 27 produces an output logic signal VL for stimulating DUT terminal 15 when terminal 15 acts as a DUT input terminal. To isolate itself from terminal 15 when not needed during leakage current tests or during logic tests when terminal 15 acts as a DUT output, source 27 tristates the VL logic signal.

Data acquisition circuit 26 samples the DUT terminal voltage VT during leakage current tests, compares that sampled terminal voltage to its expected threshold values and stores data representing the result of the comparison in an internal acquisition memory. Data acquisition circuit 26 also samples the DUT terminal voltage VT at appropriate times during logic signal tests when DUT terminal 15 acts as a DUT output terminal, determines whether the sampled terminal voltage is at a high or low logic level, and stores data indicating the result of that determination in its acquisition memory. After the logic and leakage current tests are complete, host computer 16 of FIG. 1 uses bus 18 to access the test results stored in the acquisition memory within circuit 27. Clamping circuit 22 prevents the DUT terminal 15 voltage from swinging above or below predetermined limits during a logic test. Ideally the transmission line 17 connecting local module 14 to DUT terminal 15 has an impedance matching the output impedance of logic signal source 27 to avoid undershoot or overshoot at the pulse edges of source 27 output logic test signal VL. However, since in practice close impedance matching is difficult to achieve, clamping circuit 22 is needed to minimize voltage spikes. Timing signal generator 28 receives programming data and control signals from the host computer 16 of FIG. 1 via bus 18 and bus interface circuit 30. In response to the programming data, timing signal generator 28 produces output signals controlling operations of parametric and logic signal sources 24 and 26 and clamping circuit 22. Timing signal generator uses the CLK signal from clock 20 of FIG. 1 as a timing reference.

Clamping circuit 22 includes registers 32 and 34, multiplexers 36 and 38, digital-to-analog converters (DACS) 40 and 42, diodes 44 and 46, an NPN transistor 48, a PNP transistor 50, and hot carrier Schottky diodes 52 and 54. Host computer 16 of FIG. 1 stores two data values D1 and D2 in register 32 via bus 18 and bus interface circuit 30. Multiplexer 36 supplies data D1 to the input of DAC 40 when the tester is performing a logic test and supplies data D2 to DAC 40 when the tester is performing a leakage current test. The host computer also stores two data values D3 and D4 in register 34. Multiplexer 38 forwards data D3 to the input of DAC 42 during logic tests and forwards data D4 to DAC 42 during leakage current tests. The output of DACS 40 and 42 drive bases (control terminals) of transistors 48 and 50. The collector ("load terminal") of transistor 48 is connected to a positive voltage source V while the collector of transistor 50 is grounded. Schottky diodes 52 and 54 couple the emitters (also "load terminals") transistors 48 and 50 to DUT terminal 15. Diodes 44 and 46 are connected in series between the bases of transistors 48 and 50.

During a logic test, the selected data value D1 causes DAC 40 to supply a voltage signal VLC to the base of transistor 48 of sufficient magnitude to turn on transistor 48 when the DUT terminal output voltage VT begins to fall below a predetermined minimum level. The current supplied by transistor 48 clamps VT to that minimum level. Similarly, the selected data value D3 causes DAC 42 to supply a voltage signal VHC to the base of transistor 50 sufficient to turn on transistor 50 when the DUT terminal output voltage VT attempts to rise above a predetermined maximum level. In such event current supplied by transistor 50 clamps VT to the maximum level.

Assume, for example, that the base-emitter drop of transistor 48 is 0.6 volts, that the forward bias voltage of Schottky diode 52 is 0.2 volts, and that we want to prevent VT from swinging below 0 volts. Thus host computer 16 supplies a data value D1 which would DAC 40 to set VLC to 0.8 volts. At the start of a negative-going spike in DUT terminal voltage VT, transistor 48 turns on, diode 52 becomes forward biased and source V supplies sufficient current into terminal 15 to keep the terminal voltage from dropping below 0 volts. With a base-emitter drop in transistor 50 of 0.6 volts and a forward bias voltage drop across Schottky diode 54 of 0.2 volts, to prevent VT from rising above 5 volts host computer 16 should supply a data value D3 sufficient to cause DAC 40 to set VHC to 4.2 volts. When the DUT attempts to pull terminal voltage VT above 5 volts, transistor 50 turns on and diode 54 becomes forward biased. Diode 54 and transistor 50 then shunt current from local module 15 to ground so that VT cannot rise above 5 volts.

During a leakage current test, multiplexers 36 and 38 select data values D2 and D4. Data value D2 causes DAC 40 to supply a voltage signal VLC to the base of transistor 48 which ensures transistor 48 stays off and diode 52 remains reverse biased. Similarly, data value D4 causes DAC 40 to supply a voltage signal VHC to the base of transistor 50 which turns transistor 50 off and reverse biases diode 54. For example, if DUT terminal voltage VT ranges between 0 and 5 volts during a leakage test, D2 may be set to produce a DAC 40 output voltage of 0 volts or less and D4 may be set to produce a DAC 42 output voltage of at least 5 volts. With diodes 52 and 54 reverse biased, clamping circuit 22 does not affect current flowing through the DUT terminal.

Diodes 44 and 46 of clamping circuit 22 ensure that transistors 48 and 50 do not turn on concurrently, thereby shorting source V to ground. Without diodes 44 and 46 transistors 48 and 50 could concurrently turn on as a result of a programming error when incorrect data values are delivered to DACS 40 and 42.

Parametric signal source 24 supplies a test signal to DUT terminal 15 during leakage current tests. Source 24 includes registers 53 and 55, multiplexers 56 and 58, DACS 60 and 62, $10^6$ Ohm resistors 64 and 66, and hot carrier Schottky diodes 68 and 70. Host computer 16 stores two data values D5 and D6 in register 53 and two data values D7 and D8 in register 55. Multiplexer 56 supplies either data value D5 or D6 to the input of DAC 60. Multiplexer 58 supplies either data value D7 or D8 to the input of DAC 62. Resistor 64 and diode 68 in series couple the output of DAC 60 to DUT terminal 15 while resistor 66 and diode 70 in series couple the output of DAC 62 to the DUT terminal.

When performing a high level leakage test, multiplexers 56 and 58 supply data values D6 and D7 to DACS 60 and 62, respectively with D6 sized so that DAC 60 forward biases diode 68 and with D7 sized so that DAC 62 reverse biases diode 70. In particular, the value of D6 is chosen so that the voltage drop across resistor 64 and diode 68 produces a voltage VT at DUT terminal 15 equal to the high logic level when the DUT is drawing its rated high level leakage current. If DUT terminal 15 is drawing excessive leakage current, VT will fall below the high logic level due to excessive voltage drop across resistor 64. As discussed below data acquisition circuit 26 ascertains when the DUT terminal voltage VT falls below its expected value.

When performing a low level leakage test, multiplexers 56 and 58 supply data values D5 and D8 to DACS 60 and 62. D5 is sized so that the output of DAC 60 reverse biases diode 68. The value of D8 is chosen so that diode 70 is forward biased with the voltage drop across resistor 66 and diode 70 producing a voltage VT at DUT terminal 15 equal to the nominal low logic level when the DUT is drawing its rated low level leakage current. If the DUT has excessive leakage current, VT will rise above the low logic level due to excessive voltage across resistor 66. Data acquisition circuit 26 senses when the DUT terminal voltage VT rises above its expected level.

Logic test signal source 27 stimulates DUT terminal 15 with a logic signal VL during logic tests when terminal 15 is a DUT input terminal. Before starting a logic test; the host computer 16 of FIG. 1 stores two data values D12 and D13 in a register 72. The D12 value is supplied to a DAC 74 and the D13 value is supplied to a DAC 76. The values of D12 and D13 are set so that DAC 74 produces a high logic level reference signal VHL and DAC 76 produces a low logic level reference signal VLL. The VHL and VLL reference signals are supplied to a tristate driver 78. Timing signal generator 28 supplies driver 78 with a tristate control signal TS and an input logic signal LX. During a logic test, when driver 78 is to supply logic test signal VL to DUT terminal 15, timing signal generator 28 asserts the TS signal to turn on driver 78. With TS asserted, driver 78 drives its output signal VL to either the high logic level of reference signal VHL or the low logic level of reference signal VLL depending on the state of an input logic signal VX produced by timing signal generator 28. Otherwise, during a leakage current test or when the DUT terminal is acting as a DUT output, signal generator 28 deasserts TS to tristate the driver 78 output signal VL.

The data acquisition circuit 26 includes a comparator 82 for comparing the DUT terminal voltage VT to a reference threshold voltage VTH produced by a DAC 84. Comparator 82 produces an output signal VC that is high when VT exceeds VTH and low when VTH exceeds VTH. An acquisition memory 83 stores a bit indicating the state of the VC signal when write enabled by a pulse of a signal WE from signal generator 28. Before the start of logic and parametric test procedures, host computer 16 of FIG. 1 writes three data values D9–D11 into register 88. The D9 value defines a threshold voltage VTH used during a logic test to distinguish between high and low logic levels at DUT terminal 15. The D10 value defines a threshold voltage VTH that marks the allowable lower limit of DUT terminal voltage VT in a high level leakage current test while the D11 value defines a threshold voltage marking the allowable upper limit of terminal voltage VT for a low level leakage current test. A multiplexer 86, controlled by a two-bit signal MX5 from timing signal generator 28, selects one of data values D9–D11 stored in a register 88 as input to DAC 84 depending upon the type of test being performed.

Timing signal generator 28 receives and stores programming data from host computer 16 of FIG. 1 before the start of a test and controls timing of its output signals in accordance with its stored data. Its output signals TS and VX control driver 78 and its WE output signal controls the timing of data storage by acquisition memory 83. Controller 28 also produces a set of output signals MX1–MX5 for controlling multiplexers 36, 38, 56, 58 and 86.

We can best illustrate the programming and operation of local module 14 byway of example. In the example DUT terminal 15 is hi-directional, has high and low logic levels of 5 and 0 volts, respectively, and has rated high and low level leakage currents of 1 microamp and 0.5 microamp, respectively. Local module 14 is to perform high and low level leakage current tests in succession followed by a logic test. The DUT terminal is bi-directional so that to perform the logic test, the local module must sometimes drive the DUT terminal 15 to a high logic or low logic level and must at other times sample and store the logic state of the output signal VT produced by the DUT at terminal 15.

As listed in Table I below, host computer 16 of FIG. 1 initially stores the data values D1–D13 in the various registers of module 14 of FIG. 2 sized so as to produce the DAC output signals with indicated voltages during indicated tests.

TABLE I

| DATA | SIGNAL | VOLTAGE | TEST |
| --- | --- | --- | --- |
| D1 | VLC | 0.8 V | LOGIC |
| D2 | VLC | 0.0 V | HIGH/LOW |
| D3 | VHC | 4.2 V | LOGIC |
| D4 | VHC | 5.0 V | HIGH/LOW |
| D5 | VHP | 0.0 V | LOGIC/LOW |
| D6 | VHP | 6.2 V | HIGH |
| D7 | VLP | 6.0 V | LOGIC/LOW |
| D8 | VLP | -.7 V | LOW |
| D9 | VTh | 2.5 V | LOGIC |
| D10 | VTH | 5.0 V | HIGH |
| D11 | VTH | 0.0 V | LOW |
| D12 | VHL | 5.0 V | LOGIC |
| D13 | VLL | 0.0 V | LOGIC |

From Table I we see that multiplexer 36 of clamping circuit 22 of FIG. 2 selects the data value D1 stored in register 32 when the local module is performing a logic test. The DAC 40 output signal VLC produced in response to the D1 data is 0.8 volts. When the DUT terminal voltage VT reaches 0 volts, the drop across the base-emitter junction of transistor 48 is 0.6 V, the drop across diode 52 is 0.2 V, diode 52 becomes forward biased, and transistor 48 begins to turn on. Transistor 48 supplies sufficient current to prevent VT from falling below 0 volts. During a high or low leakage current test, multiplexer 36 selects D2 as input to DAC 40, and D2 is sized so that VLC is 0 volts. As long as the DUT terminal voltage does not fall below −0.6 V during the low leakage current test, transistor 48 remains off and diode 52 remains reverse biased. Thus diode 52, which has very little leakage current when reverse biased, effectively isolates transistor 48 from DUT terminal 15 so that transistor 48 supplies no leakage current to DUT terminal 15.

Multiplexer 38 of the clamping circuit 22 of FIG. 2 selects data value D3 in register 34 as input to DAC 42 when local module 14 is performing a logic test. DAC 42 output signal VHC produced in response to the D3 data is 4.2 volts. When DUT terminal voltage VT rises to 5 V, transistor 50 begins to turn on and diode 54 becomes forward biased. The total drop across the base-emitter junction of transistor 50 and diode 54 is 0.8 V. Transistor 50 sinks sufficient current to prevent VT from rising above 5 volts. During a high or low leakage current test, multiplexer 38 selects data D4 as input to DAC 42. Data D4 sets VHC at 5 volts. This reverse biases diode 54 for normal values of VT (0–5 V) so as to substantially isolate transistor 50 from DUT terminal 15. With diode 54 isolating transistor 50, the transistor cannot sink appreciable leakage current from terminal 15.

Multiplexer 56 of the parametric signal generator 24 of FIG. 2 selects D5 as input to DAC 60 during a logic test or during a low level leakage current test. Data D5 sets the DAC 60 output signal VHP to 0.0 V to ensure that diode 68 remains reverse biased. Diode 68 thus isolates DAC 60 from DUT terminal 15. During a high level leakage current test multiplexer 56 selects data D6 causing DAC 60 to set VHP at 6.2 volts. If the high level leakage current at DUT terminal 15 is the rated 1 microamp or less, terminal voltage VT will be at least 5.0 volts. Multiplexer 58 selects D7 as input to DAC 62 during a logic test or during a high level leakage current test. D7 is suitably set to produce a DAC 62 output signal VLP signal of 6.0 V. This voltage reverse biases diode 70 for all expected values of terminal voltage VT, thereby substantially isolating DAC 62 from DUT terminal 15. During a low level leakage current test multiplexer 58 selects D8 as input to DAC 62, thereby producing a DAC output voltage VLP of −0.7 volts. At the rated low level leakage current of 0.5 microamps or less, a VLP of −0.7 volts will produce a VT of at least 0 volts. A DUT terminal voltage VT exceeding 0.0 volts indicates that the low level leakage current exceeds its rated value.

Multiplexer 86 of data acquisition circuit 26 selects D9 as input to DAC 84 during logic tests. In this example D9 is set to produce a DAC 84 output voltage VTH of 2.5 V. If VT exceeds 2.5 V, comparator 82 drives its output signal VC high. If VT is less than 2.5, comparator 82 drives output signal VC low. Multiplexer 86 selects D10 during a high level leakage current test. D10 causes DAC 84 to produce a 5.0 V VTH output. When VT exceeds 5.0 V comparator 82 drives its output signal VC high indicating that the DUT terminal 15 has passed the high level leakage current test. When VT is less than 5.0 V, comparator 82 drives its output signal VC low indicating DUT terminal 15 has failed the high level leakage current test. Multiplexer 86 selects D11 during a low level leakage current test. D11 tells DAC 84 to produce a 0.0 V VTH output. When VT exceeds 0.0 V comparator 82 drives its output signal VC high indicating that DUT terminal 15 has passed the low level leakage current test. When VT is less than 0.0 V, comparator 82 drives its output signal VC low to indicate DUT terminal 15 has failed the high level leakage current test.

To program local module 14 to test the DUT, host computer 16 of FIG. 1 stores the D1–D11 data in the local module registers, transmits programming data to timing signal generator 28 via bus 18, and then concurrently sends a START signal to the signal generator 28 of each local module via bus 18. In respond to the START signal, signal generator 28 begins generating its output put signals in accordance with its stored programming data.

During the course of the test, as indicated by its programming data, controller 28 initially deasserts TS to tristate the VL output signal of driver 78 and sets multiplexer control MX1–MX5 to switch all multiplexers to select the DAC input data (D2, D4, D6, D7 and D10) appropriate for a high level leakage current test per Table I above. Controller 28 then pulses the write enable signal WE to acquisition memory 83 causing it to sample and store at a first address the state of the VC output signal of comparator 82. This bit indicates whether DUT terminal 15 has passed the high level leakage current test. Controller 28 then sets control signals MX1–MX5 to switch the multiplexers to select the DAC input data (D2, D4, D5, D8 and D11) appropriate for a low level leakage current test. Timing signal generator 28 then again pulses the write enable signal WE causing acquisition memory 83 to sample the VC output signal and store at a next address a bit indicating whether DUT terminal 15 has passed the low level leakage current test.

To prepare for the ensuing logic test, controller 28 then sets the MX1–MX5 multiplexer control signals so that the various multiplexers select data (D2, D3, D5, D7 and D9)

appropriate for a logic test per Table I above. Thereafter, whenever local module 14 is to send a high or low level signal to DUT terminal 15, signal generator 28 sets VX to the appropriate state and sets output signal TS to turn on tristate driver 78, thereby supplying a 5.0 V or 0.0 V signal to DUT terminal 15. Alternatively, whenever acquisition memory 83 is to store a bit indicating the state of the DUT response signal VT, signal Generator 28 pulses the write enable signal WE causing the acquisition memory to sample VC and to store a bit indicating whether VT is above or below the 2.5 V threshold established by selected data D9. When the logic test is complete, the host computer 16 reads the test data out of memory 83 via bus 18. The first two bits of the data indicate whether DUT terminal 15 passed the high and low leakage current tests and remaining bits of data from acquisition memory 83 form the results of the logic test.

Figure 3:
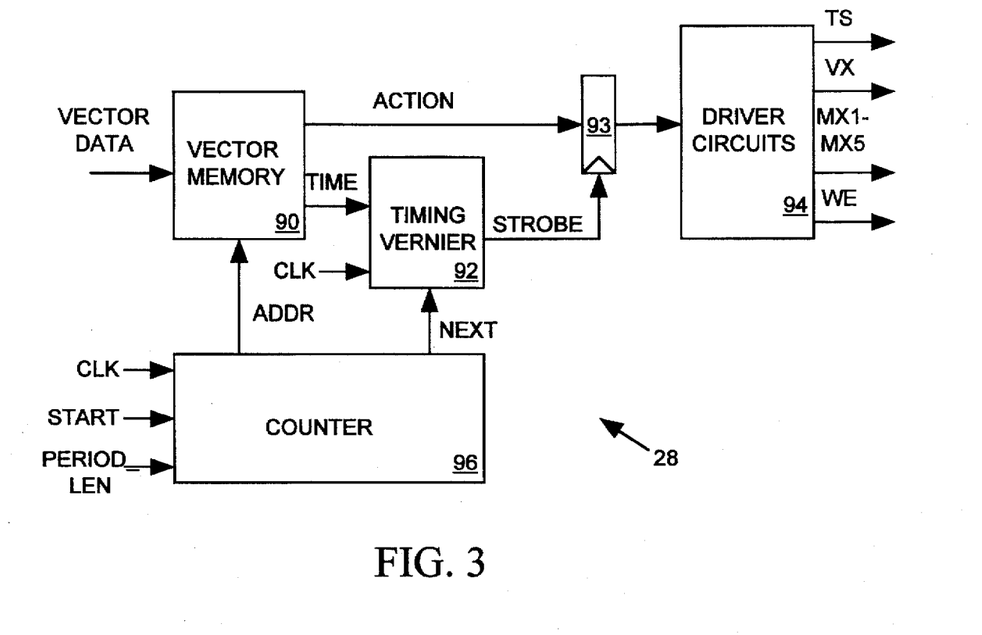
FIG. 3 illustrates the timing controller of FIG. 2 in more detailed block diagram form.

FIG. 3 illustrates timing signal generator 28 of FIG. 2 in more detailed block diagram form. To program timing signal generator 28 the host computer 16 of FIG. 1 writes a sequence of "vector data" words to a vector memory 90. The test is organized into a set of consecutive time periods, each lasting a given number of system clock CLK signal pulses. A separate vector data word is stored in memory 90 for each time period of the test. Each vector data word includes ACTION bits and TIME bits. Each ACTION bit indicates a state to which timing signal generator 28 is to drive a corresponding one of its output signals during the time period. The TIME bits indicate a time during the time period that the timing signal generator is to take the actions indicated by the ACTION bits.

Before starting a test, the host computer supplies data value PERIOD_LEN to a counter 96 indicating the number of CLK signal pulses in each test period. The START signal produced by the host computer resets counter 96 and tells it to begin counting CLK signal pulses to determine when each test period begins. At the start of each test period, counter 96 increments an output address supplied to vector memory 90 causing the vector memory to read out the vector data word at the indicated address. The TIME bits of the read out word are supplied to a timing vernier 92. Counter 96 sends a NEXT signal pulse to timing vernier 92 at the start of each test period. In response to the NEXT signal timing vernier 92, using the CLK signal as a timing reference, waits for a time indicted by the TIME bits and then supplies a STROBE signal pulse to a latch 93. Latch 93 latches the ACTION bits onto inputs of a set of driver circuits 94 which drive output signals TS, VX, MX1-MX5 and WE to states indicated by their corresponding ACTION bits.

Figure 4:
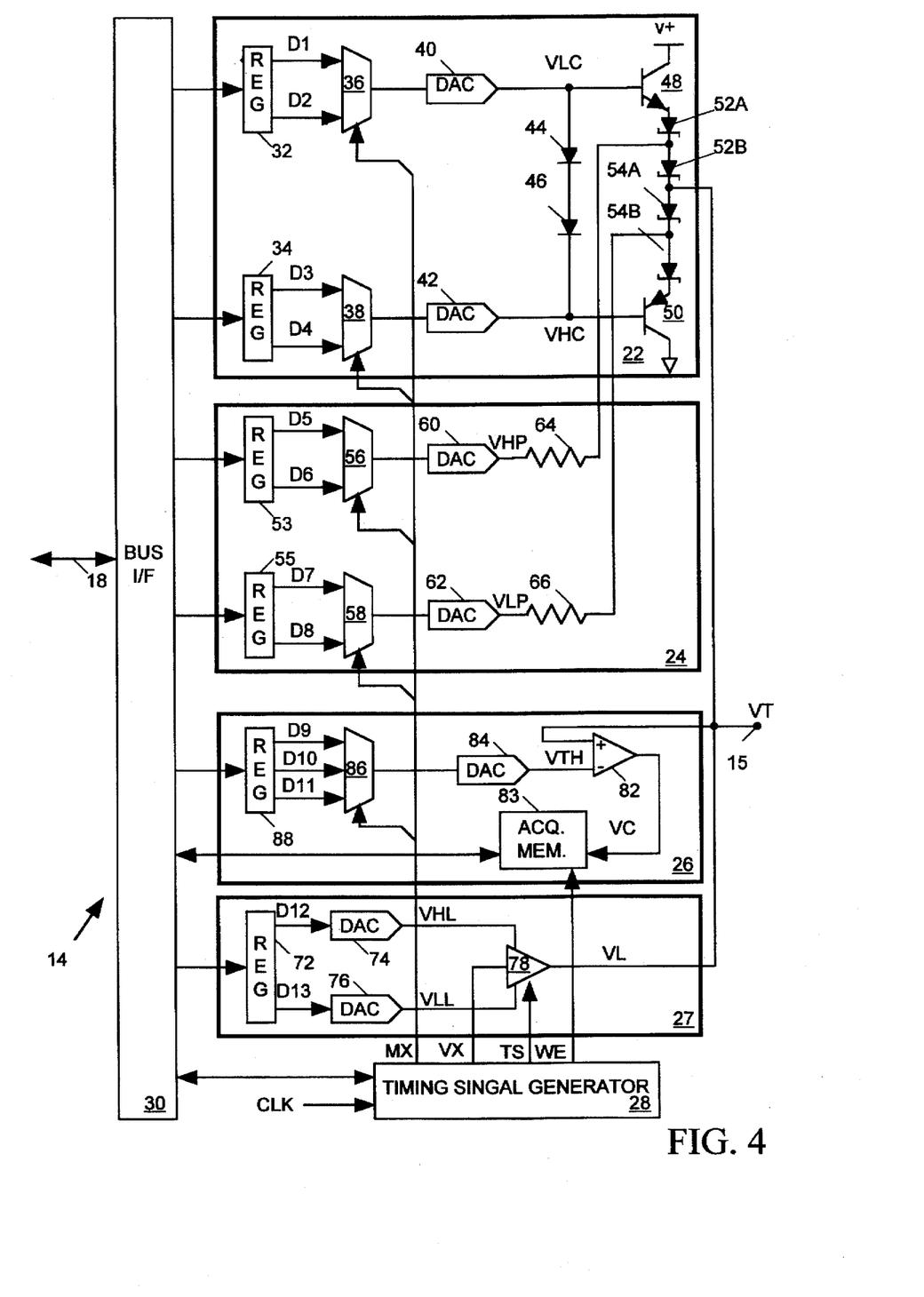
FIG. 4 illustrates an alternative embodiment of a local module of the circuit tester of FIG. 1 in combined block and schematic diagram form.

FIG. 4 illustrates an alternative embodiment of a local module 14 of FIG. 1 generally similar to the embodiment of local module 14 shown in FIG. 2. Similar elements in FIGS. 2 and 4 are similarly numbered. The only difference between the embodiments of FIGS. 2 and 4 lies in the arrangement of Schottky diodes linking the clamping circuit 22 and the parametric signal source 24 to the DUT terminal 15. In FIG. 2 resistors 64 and 66 of source 24 and transistors 48 and 50 of clamping circuit 22 are linked to DUT terminal 15 via separate Schottky diodes 52, 54, 68 and 70. In contrast, as shown in FIG. 4, the emitter of transistor 48 is connected to DUT terminal 15 through a series of two Schottky diodes 52A and 52B and the emitter of transistor 50 is connected to terminal 15 through a series of two Schottky diodes 54A and 54B. Diode 52B also links resistor 64 of parametric signal source 24 to terminal 15 while diode 54B also links resistor 66 of source 24 to terminal 15. The embodiment of module 14 of FIG. 4 is programmed in the same way as the embodiment of FIG. 2 although values of D1–D8 must be altered slightly to account for the presence of the extra Schottkey diodes in the paths between the PUT terminal and transistors 48 and 50. One advantage to the embodiment of FIG. 4 is that the Schottkey diode arrangement of FIG. 4 presents less capacitance at terminal 15 and therefore allows the logic test signal VL to operate with sharp edges at a higher frequency than the Schottky diode arrangement of FIG. 2.

The circuit of FIG. 4 also improves clamping response to voltage swings at DUT terminal 15. In the circuit of FIG. 2, when the DUT terminal voltage VT begins to fall below the threshold set by the VLC output of DAC 40, DAC 40 must charge the inherent capacitances of diode 52 and the base-emitter junction of transistor 48 before it can turn on transistor 48 and limit the VT voltage swing. Similarly, when DUT terminal voltage VT begins to rise above the threshold set by DAC 42, DAC 42 must charge the inherent capacitances of diode 54 and the base-emitter junction of transistor 50 before it can turn on transistor 50. The time required to charge this capacitance delays the response of the clamping circuit to voltage swings at the DUT terminal 15.

Referring now to the circuit of FIG. 4, during logic tests when clamping circuit 22 is to limit voltage swings at DUT terminal 15, the output voltages DACs 60 and 62 of parametric signal source 24 may be set to precharge diodes 52A and 54B and the base-emitter diodes of transistors 48 and 58 so that the clamping circuit 22 can more quickly respond to voltage swings at the DUT terminal 15. For example if the swing in VT is to be limited to 0–5 V, we adjust D1 so that the VLC output of DAC 40 is 1.0 volt to account for a 0.6 V drop across the emitter-base junction of transistor 48 and a 0.2 V forward bias drop across each of diodes 52A and 52B. To precharge diode 52A and the emitter-base junction of transistor 48, we set D5 so that the output VHP of DAC 60 to 0.2 V. While the emitter-base junction of transistor 48 and diode 52 are forward biased for all values of DUT terminal voltage VT, diode 52B remains reverse biased until VT reaches 0 volts. When VT starts to fall below 0 volts, transistor 48 begins to supply current to terminal 15 to prevent VT from falling below 0. The only delay in response is the time required to charge the relatively small inherent capacitance of diode 52B, the capacitance of diode 54A and the emitter-base junction of transistor 48 having been precharged.

Similarly, we may choose D3 so that the VHC output of DAC 42 is 4.0 volts to account for the 0.6 V drop across the emitter- base junction of transistor 50 and the 0.2 V forward bias drop across each of diodes 54A and 54B. We also set D7 so that the output VLP of DAC 62 is 4.8 V. This value of VLP precharges the inherent capacitances of diode 54B and the emitter-base junction of transistor 50 but keeps diode 54A reverse biased until VT begins to rise above 5.0 V. At that point after only a relatively small delay required for charging the inherent capacitance of diode 54A, the transistor 50 begins to draw current from DUT terminal 15 so as to limit the DUT terminal voltage rise.

While the foregoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus responsive to input control signals for performing logic and parametric tests on a digital circuit having a circuit terminal, the apparatus comprising:

a logic signal source coupled to the circuit terminal for supplying a logic test signal to the circuit terminal in response to assertion of an input first control signal, the logic test signal alternating between high and low logic levels;

a first diode; and a parametric test signal source connected to the circuit terminal through said first diode for supplying a parametric test signal to the circuit terminal via said first diode upon assertion of an input second control signal, and for reverse biasing said first diode when said second control signal is not asserted.

2. The apparatus in accordance with claim 1 wherein said first diode is a Schottkey diode.

3. The apparatus in accordance with claim 1 further comprising:

a second diode; and clamping means connected to the circuit terminal through said second diode for responding to assertion of an input third control signal by supplying a clamping signal to said circuit terminal via said first diode to prevent a voltage of said circuit terminal from swinging beyond a predetermined limit, and for reverse biasing said second diode when said third control signal is not asserted.

4. The apparatus in accordance with claim 3 wherein said first and second diodes are Schottkey diodes.

5. The apparatus in accordance with claim 1 further comprising detecting means coupled to the circuit terminal for detecting whether a voltage at the circuit terminal rises above a predetermined threshold level.

6. The apparatus in accordance with claim 1 further comprising:

a second diode;

clamping means connected to the circuit terminal through said second diode for responding to assertion of an input third control signal by supplying a clamping signal to said circuit terminal via said first diode to prevent a voltage of said circuit terminal from swinging beyond a predetermined limit, and for reverse biasing said second diode when said third control signal is not asserted; and detecting means coupled to the corresponding circuit terminal for detecting whether a voltage at the circuit terminal rises above a predetermined threshold level.

7. The apparatus in accordance with claim 6 wherein said first and second diodes are Schottkey diodes.

8. The apparatus in accordance with claim 1 wherein said logic signal source comprises:

a signal generator for generating a first output signal varying between first and second states; and means receiving said first output signal from said signal generator and receiving said first control signal and having a first output node connected to said circuit terminal, for generating and supplying said logic test signal to said first node when said input first control signal is asserted, variations between the high and low levels of said logic test signal being timed in response to the first and second states of said first output signal, and for placing said first output node in a tristate condition when said first control signal is not asserted.

9. The apparatus in accordance with claim 1 wherein said parametric test signal source comprises:

an adjustable voltage source receiving said second control signal and having a second output node, for producing a first output voltage at said second output node when said second control signal is asserted and for producing a second output voltage at said second output node when said second control signal is not asserted; and a resistor, the resistor and said first diode being connected in series between said second output node and said circuit terminal, the first output voltage being sufficient to forward bias said first diode and the second output voltage being sufficient to reverse bias said first diode when a voltage of said circuit terminal is within a range defined by said high and low logic levels.

10. The apparatus in accordance with claim 3 wherein said clamping means comprises:

a fixed voltage source;

a transistor having a control terminal, a first load terminal connected to said fixed voltage source, and a second load terminal coupled to said circuit terminal via said second diode; and an adjustable voltage source responsive to said third control signal for supplying a first voltage to said control terminal sufficient to turn on said transistor and forward bias said second diode when said third control signal is asserted and the voltage of said circuit terminal reaches said predetermined limit and for supplying a second voltage to said control terminal sufficient to turn off said transistor and reverse bias said second diode when said third control signal is not asserted.

11. The apparatus in accordance with claim 3 wherein said parametric test signal source comprises:

an adjustable voltage source receiving said second control signal and having a second output node, for producing a first output voltage at said second output node when said second control signal is asserted and for producing a second output voltage at said second output node when said second control signal is not asserted; and a resistor, the resistor and said first diode being connected in series between said second output node and said circuit terminal, the first output voltage being sufficient to forward bias said first diode and the second output voltage being sufficient to reverse bias said first diode when a voltage of said circuit terminal is within a range defined by said high and low logic levels, and wherein said clamping means comprises:

a fixed voltage source;

a transistor having a control terminal, a first load terminal connected to said fixed voltage source, and a second load terminal coupled to said circuit terminal via said second diode; and an adjustable voltage source responsive to said third control signal for supplying a first voltage to said control terminal sufficient to turn on said transistor and forward bias said second diode when said third control signal is asserted and the voltage of said circuit terminal reaches said predetermined limit and for supplying a second voltage to said control terminal sufficient to turn off said transistor and reverse bias said second diode when said third control signal is not asserted.

12. The apparatus in accordance with claim 11 wherein said first and second diodes are Schottkey diodes.

13. An apparatus for performing logic and parametric tests on a digital circuit having a plurality of circuit terminals, the logic and parametric tests being defined by input data, the apparatus comprising:

a plurality of local modules each connected to corresponding one of said circuit terminals for performing portions of said logic and parametric tests with respect to corresponding circuit terminal in accordance with a separate portion of said input data; and bus means connected to said local modules for conveying the input data to the local modules, wherein each of said local modules comprises:

a logic signal source having a first output terminal coupled to the corresponding circuit terminal for selectively driving its first output terminal to a high logic level, to a low logic level or to a tristate condition at times determined by assertion of first control signals supplied as input thereto;

a first diode;

parametric test signal source connected to the circuit terminal through said first diode for alternatively supplying a parametric test signal to the circuit terminal via said first diode and reverse biasing said first diode at times determined by assertion of a second control signal supplied as input thereto; and timing control means connected to said bus means for receiving said input data and for asserting said first and second control signals supplied to said logic signal source and said parametric test signal source at times indicated by said input data.

14. The apparatus in accordance with claim 13 wherein the timing control means of each local module asserts an output fourth control signal at times indicated by its received input data and wherein each local module further comprises:

a second diode; and clamping means connected to the circuit terminal through said second diode for receiving and responding to assertion of said fourth control signal by supplying a clamping signal to said circuit terminal via said first diode to prevent a voltage of said circuit terminal from swinging beyond a predetermined limit, and for reverse biasing said second diode when said third control signal is not asserted.

15. The apparatus in accordance with claim 13 wherein each local module further comprises detecting means coupled to the corresponding circuit terminal for detecting whether a voltage at the circuit terminal rises above a predetermined threshold level.

16. The apparatus in accordance with claim 13 wherein said parametric test signal source comprises:

an adjustable voltage source receiving said second control signal and having a second output node, for producing a first output voltage at said second output node when said second control signal is asserted and for producing a second output voltage at said second output node when said second control signal is not asserted; and a resistor, the resistor and said first diode being connected in series between said second output node and said circuit terminal, the first output voltage being sufficient to forward bias said first diode and the second output voltage being sufficient to reverse bias said first diode when a voltage of said circuit terminal is within a range defined by said high and low logic levels.

17. The apparatus in accordance with claim 14 wherein said clamping means comprises:

a fixed voltage source;

a transistor having a control terminal, a first load terminal connected to said fixed voltage source, and a second load terminal coupled to said circuit terminal via said second diode; and an adjustable voltage source responsive to said third control signal for supplying a first voltage to said control terminal sufficient to turn on said transistor and forward bias said second diode when said third control signal is asserted and the voltage of said circuit terminal reaches said predetermined limit and for supplying a second voltage to the control terminal sufficient to turn off said transistor and reverse bias said second diode when said third control signal is not asserted.

18. The apparatus in accordance with claim 14 wherein said parametric test signal source comprises:

an adjustable voltage source receiving said second control signal and having a second output node, for producing a first output voltage at said second output node when said second control signal is asserted and for producing a second output voltage at said second output node when said second control signal is not asserted; and a resistor, the resistor and said first diode being connected in series between said second output node and said circuit terminal, the first output voltage being sufficient to forward bias said first diode and the second output voltage being sufficient to reverse bias said first diode when a voltage of said circuit terminal is within a range defined by said high and low logic levels, and wherein said clamping means comprises:

a fixed voltage source;

a transistor having a control terminal, a first load terminal connected to said fixed voltage source, and a second load terminal coupled to said circuit terminal via said second diode; and an adjustable voltage source responsive to said third control signal for supplying a first voltage to said control terminal sufficient to turn on said transistor and forward bias said second diode when said third control signal is asserted and the voltage of said circuit terminal reaches said predetermined limit and for supplying a second voltage to said control terminal sufficient to turn off said transistor and reverse bias said second diode when said third control signal is not asserted.

19. The apparatus in accordance with claim 18 wherein said first and second diodes are Schottkey diodes.

20. An apparatus responsive to input control signals for performing logic and parametric tests on a digital circuit having a circuit terminal, the apparatus comprising:

a logic signal source coupled to the circuit terminal for supplying a logic test signal to the circuit terminal in response to assertion of an input first control signal;

a first diode;

a second diode connected in series with said first diode;

a parametric test signal source connected to the circuit terminal through said first diode for supplying a parametric test signal to the circuit terminal via said first diode upon assertion of an input second control signal; and clamping means connected to the circuit terminal through said first and second diodes in series for responding to assertion of an input third control signal by supplying a clamping signal to said circuit terminal through said first and second diodes to prevent a voltage of said circuit terminal from swinging beyond a predetermined limit.

21. The apparatus in accordance with claim 20 wherein said first and second diodes are Shottkey diodes.

22. The apparatus in accordance with claim 20 further comprising detecting means coupled to the circuit terminal for detecting whether a voltage at the circuit terminal rises above a predetermined threshold level.

23. The apparatus in accordance with claim 20 wherein said logic signal source comprises:

signal generator for generating a first output signal varying between first and second states; and means receiving said first output signal from said signal generator and receiving said first control signal and having a first output node connected to said circuit terminal, for generating and supplying said logic test signal to said first node when said input first control signal is asserted, the logic test signal alternating between high and low logic levels timed in response to the first and second states of said first output signal, and for placing said output node in a tristate condition when said first control signal is not asserted.

24. The apparatus in accordance with claim 20 wherein said parametric test signal source comprises:

an adjustable voltage source receiving said second control signal and having a second output node, for producing a first output voltage at said second output node when said second control signal is asserted and for producing a second output voltage at said second output node when said second control signal is not asserted; and a resistor, the resistor and said first diode being connected in series between said second output node and said circuit terminal.

25. The apparatus in accordance with claim 20 wherein said clamping means comprises:

a fixed voltage source;

a transistor having a control terminal, a first load terminal connected to said fixed voltage source, and a second load terminal coupled to said circuit terminal via said first and second diode in series; and an adjustable voltage source responsive to said third control signal for supplying a first voltage to said control terminal sufficient to turn on said transistor and forward bias said first and second diodes when said third control signal is asserted and the voltage of said circuit terminal reaches said predetermined limit and for supplying a second voltage to said control terminal sufficient to reverse bias said second diode when said third control signal is not asserted.

26. The apparatus in accordance with claim 20 wherein said parametric test signal source comprises:

an adjustable voltage source receiving said second control signal and having a second output node, for producing a first output voltage at said second output node when said second control signal is asserted and for producing a second output voltage at said second output node when said second control signal is not asserted; and a resistor, the resistor and said first diode being connected in series between said second output node and said circuit terminal, the second output voltage being sufficient to reverse bias said first diode when a voltage of said circuit terminal is within a range defined by said high and low logic levels, and wherein said clamping means comprises:

a fixed voltage source;

a transistor having a control terminal, a first load terminal connected to said fixed voltage source, and a second load terminal coupled to said circuit terminal via said first and second diodes in series; and an adjustable voltage source responsive to said third control signal for supplying a first voltage to said control terminal sufficient to turn on said transistor and forward bias said first and second diodes when said third control signal is asserted and the voltage of said circuit terminal reaches said predetermined limit and for supplying a second voltage to said control terminal sufficient to reverse bias said first diode when said third control signal is not asserted.

27. An apparatus for performing logic and parametric tests on a digital circuit having a plurality of circuit terminals, the logic and parametric tests being defined by input data, the apparatus comprising:

a plurality of local modules each connected to corresponding one of said circuit terminals for performing aspects of said logic and parametric tests with respect to corresponding circuit terminal in accordance with a separate portion of said input data; and bus means receiving said input data and connected to said local modules for conveying input data to each local module, wherein each of said local modules comprises:

timing control means connected to said bus means for receiving said input data and for asserting output first, second and third control signals at times indicated by said input data;

logic signal source receiving the first control signals and having a first output terminal coupled to the corresponding circuit terminal for selectively driving its first output terminal to a high logic level, to a low logic level or to a tristate condition at times determined by the first control signal;

a first diode;

a second diode connected in series with said first diode;

parametric test signal source receiving the second control signal and connected to the circuit terminal through said first diode for supplying a parametric test signal to the circuit terminal via said first diode at times determined by said second control signal; and clamping means receiving the third control signal and connected to the circuit terminal through said first and second diodes in series for supplying a clamping signal to said circuit terminal via said first and second diodes to prevent a voltage of said circuit terminal from swinging beyond a predetermined limit when said third control signal is asserted and for reverse biasing said first diode when said third control signal is not asserted.

28. The apparatus in accordance with claim 27 wherein each local module further comprises detecting means coupled to the corresponding circuit terminal for detecting whether a voltage at the circuit terminal rises above a predetermined threshold level.

29. The apparatus in accordance with claim 27 wherein said parametric test signal source comprises:

an adjustable voltage source receiving said second control signal and having a second output node, for alternatively supplying first and second output voltages to said second output node in response to said second control signal; and a resistor connected in series with said first diode between said second output node and said circuit terminal.

30. The apparatus in accordance with claim 27 wherein said clamping means comprises:

a fixed voltage source;

a transistor having a control terminal, a first load terminal connected to said fixed voltage source, and a second load terminal coupled to said circuit terminal via said first and second diodes in series; and an adjustable voltage source responsive to said third control signal for supplying a first voltage to said control terminal sufficient to turn on said transistor and forward bias said first and second diodes when said third control signal is asserted and the voltage of said circuit terminal reaches said predetermined limit.

31. The apparatus in accordance with claim 27 wherein said first and second diodes are Shottkey diodes.

* * * * *